(12) United States Patent
Goswami et al.

(10) Patent No.: US 7,863,176 B2
(45) Date of Patent: Jan. 4, 2011

(54) LOW-RESISTANCE INTERCONNECTS AND METHODS OF MAKING SAME

(75) Inventors: Jaydeb Goswami, Boise, ID (US); Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/119,994

(22) Filed: May 13, 2008

(65) Prior Publication Data

US 2009/0283907 A1    Nov. 19, 2009

(51) Int. Cl.
*H01L 23/52* (2006.01)
(52) U.S. Cl. ............... 438/597; 438/682; 438/684; 257/E23.141
(58) Field of Classification Search .......... 257/E23.142, 257/E23.145, E23.157, E23.163, E23.141, 257/E23.164; 438/584, 682, 597, 684, 638, 438/685, 618
See application file for complete search history.

(56) References Cited

U.S. PATENT DOCUMENTS

| | | | |
|---|---|---|---|
| 5,635,423 A * | 6/1997 | Huang et al. | 438/638 |
| 6,043,145 A * | 3/2000 | Suzuki et al. | 438/622 |
| 6,204,166 B1 | 3/2001 | McTeer | |
| 6,294,451 B1 * | 9/2001 | Yoshizawa | 438/597 |
| 6,380,079 B1 * | 4/2002 | Lee | 438/675 |
| 7,262,505 B2 | 8/2007 | Ahn et al. | |
| 2005/0040449 A1 * | 2/2005 | Inoue et al. | 257/296 |
| 2005/0095838 A1 * | 5/2005 | Jeong et al. | 438/622 |
| 2006/0157771 A1 * | 7/2006 | Choi et al. | 257/306 |
| 2008/0176396 A1 * | 7/2008 | Futase et al. | 438/652 |

* cited by examiner

*Primary Examiner*—Matthew S Smith
*Assistant Examiner*—Michele Fan
(74) *Attorney, Agent, or Firm*—Fletcher Yoder

(57) ABSTRACT

Devices and methods for providing low-resistance interconnects in a semiconductor device are provided. Specifically, one or more embodiments of the present invention relate to disposing a conductive material in a trench without disposing a resistive barrier material between the conductive material and the sidewalls of the trench so that the conductive material takes up the full width of the trench. For example, the trench may be disposed over one or more contacts made of a barrier material such as titanium nitride that also acts as a seed, and the conductive material may be grown on top of the titanium nitride to fill the trench.

14 Claims, 4 Drawing Sheets

LOW-RESISTANCE INTERCONNECTS AND METHODS OF MAKING SAME

BACKGROUND

1. Field Of The Invention

Embodiments of the present invention relate generally to the field of semiconductor devices. More particularly, embodiments of the present invention relate to improved semiconductor devices and improved fabrication techniques for semiconductor devices.

2. Description Of The Related Art

As electronics continue toward greater miniaturization and faster processing speeds, various techniques have been developed for more compact packaging and increased transmission speeds in semiconductor chips. For example, one trend has been the stacking of circuit components in multiple layers on a chip. This allows more components to be fabricated in a given area and also reduces the lengths of the vertical interconnects, the conductive lines that electrically couple the circuit components on the chip. Decreasing the length of these electrical connections reduces RC delay and wire inductance, thereby increasing the signal transmission speed. Another trend in semiconductor fabrication has been the use of narrower interconnects. The use of narrower interconnects reduces the amount of chip real-estate that is used by electrical connections, and permits more circuit components to be fabricated within a given area.

One drawback of narrower vertical interconnects, however, is that the smaller cross-sectional area of the conductive material in the interconnect may increase the electrical resistance of the interconnect, resulting in increased heat and a greater likelihood of device failure. Furthermore, a typical interconnect usually includes resistive layers, such as a barrier layer used to prevent electrical and chemical interactions between the conductive interconnect and the surrounding dielectric and a seed layer used to promote the growth of the conductive metal within the interconnect. These resistive layers have a relatively small effect on the overall resistance of the interconnect when the interconnect is relatively large, but as interconnects become more narrow, these layers use up an increasing amount of the available space within the interconnect and have a far greater effect on the overall interconnect resistivity.

Therefore, it may be advantageous to provide an improved device and process for fabricating a conductive interconnect within a semiconductor device.

DETAILED DESCRIPTION

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Embodiments of the present invention generally relate to methods for fabricating a low-resistance interconnect. Some embodiments of the present invention are directed to semiconductor devices that have been formed or partially formed in accordance with these methods. Specifically, one or more embodiments of the present invention relate to forming a dual-damascene interconnect structure, including a vertical component(s), referred to herein as a contact, and a horizontal component(s), referred to herein as a "trench conductor." The contacts comprise a conductive material that may act as both a barrier and/or seed for the conductive material formed in the trench. In this way, the conductive material forming the trench conductor may fill the full width of the trench, increasing the overall conductivity of the interconnect.

In accordance with embodiments, low-resistance interconnects may be formed over any kind of semiconductor circuit components known in the art, such as transistors, photodiodes, flash memory, random access memory (RAM), phase change memory (PCRAM), and logic gates, such as NAND gates, for example. A typical semiconductor device may also include an array of such components or an integrated circuit, for example. Furthermore, certain embodiments may include one or more metal plugs, configured to provide an electrical coupling between the low-resistance interconnect and the semiconductor circuit components, as will be described further below. In certain embodiments, the metal plug may include tungsten deposited by CVD, for example.

Figure 1:
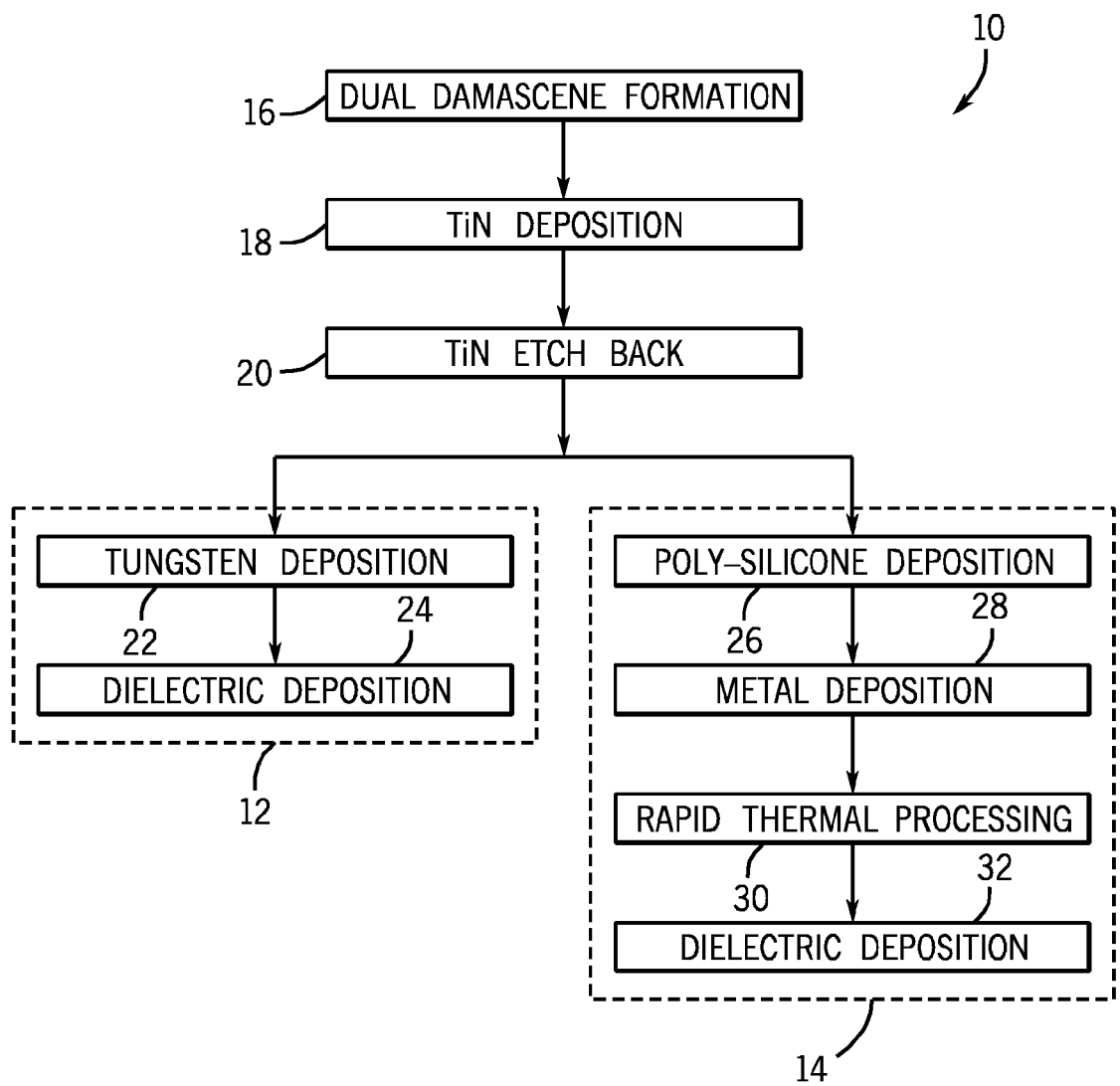
FIG. 1 is a flow chart depicting processes for fabricating a low-resistance interconnect in accordance with one or more embodiments of the present invention.

FIG. 1 depicts one embodiment of a manufacturing process 10 for fabricating low-resistance interconnects. Specifically, FIG. 1 depicts a manufacturing process 10 that includes two alternate sub-processes: a metal sub-process 12, in which an interconnect includes a metal conductor, and a poly-silicon sub-process 14, in which an interconnect includes a poly-silicon conductor. Throughout the description of the process depicted in FIG. 1, reference will also be made to the corresponding intermediate physical structures depicted in FIGS. 2-10, which may result at the end of various process steps. It will be appreciated that the illustrations provided are not drawn to scale.

Figure 2:
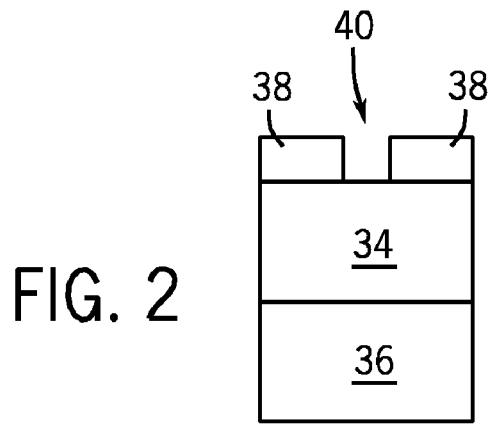
FIGS. 2-10 are cross-sectional views of a low-resistance interconnect that illustrate the process steps used in fabricating the low-resistance interconnect in accordance with one or more embodiments of the present invention.
Figure 3:
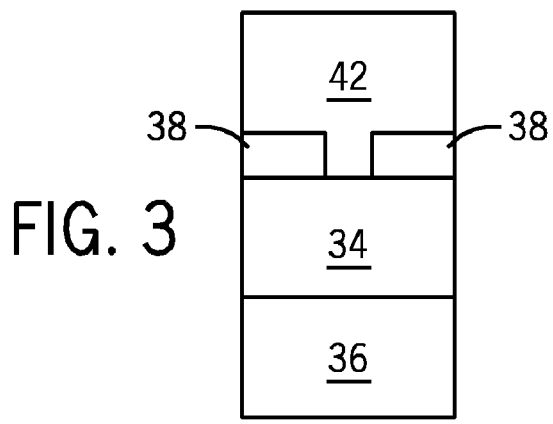
Figure 4:
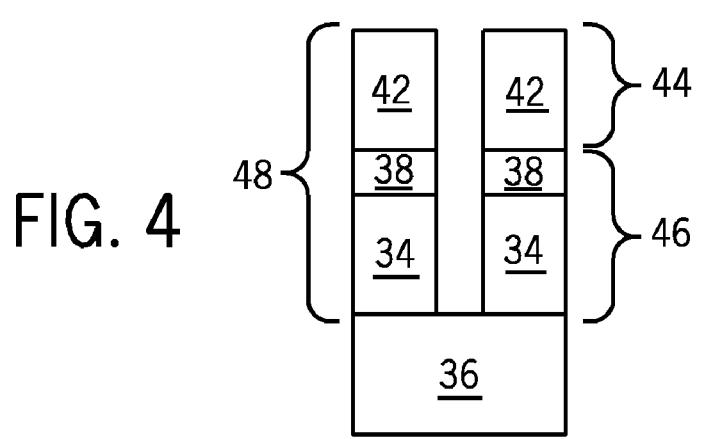

Manufacturing process 10 begins with the formation of a dual-damascene structure over a semiconductor device as indicated at step 16 and illustrated in FIGS. 2-4. A typical damascene process may involve depositing layers of dielectric material, patterning spaces (e.g., recesses, cavities, openings, holes, trenches, channels, etc.) within the dielectric material that define the desired electrical connections and depositing a conductor (i.e., a conductive material) into the patterned spaces. A typical dual-damascene process involves depositing two such layers: one layer for vertical components (referred to herein as "contacts") and another for horizontal components (referred to herein as "lines").

Specifically, the formation of the dual-damascene structure may begin by depositing a first dielectric 34 over the metal plug 36, as shown in FIG. 2. For example, the first dielectric 34 may include boro-phospho-silicate glass (BPSG) deposited by chemical vapor deposition (CVD), to a thickness of approximately 100 to 500 nanometers. Next, a second dielectric 38 is deposited over the first dielectric 34. The second dielectric 38 may include silicon nitrides (SiNx) such as Si3N4 deposited by CVD to a thickness of approximately 10 to 50 nanometers. After the second dielectric 38 is deposited over the first dielectric 34, a space such as through-hole 40 may be formed in the second dielectric 38. A person of ordinary skill in the art will recognize various methods of forming the through-hole 40. It will be understood, for example, that the formation of the through-hole 40 may involve the use of photolithography techniques, wherein a coating of photoresist is deposited over the top surface of the second dielectric 38 and exposed to a pattern of light that defines the desired structures. Additionally, formation of the through-hole 40 may be realized by any technique or combination of techniques known in the art, including wet or dry etching techniques, for example. In one embodiment, the etchant used in the formation of the through-hole 40 is selective to the second dielectric 38, such that the through-hole 40 will pass completely through the second dielectric 38 as shown in FIG. 2 without substantially disturbing the first dielectric 34.

The formation of the dual-damascene structure indicated at step 16 may also include the deposition of a third dielectric 42, as shown in FIG. 3. The third dielectric 42 may include silicon dioxide deposited in a tetraethyl orthosilicate (TEOS) based CVD process to a thickness of approximately 50 to 300 nanometers. As shown in FIG. 3, the third dielectric 42 blankets the second dielectric 38 and fills the through-hole 40.

After deposition of the third dielectric 42, a trench 44 is formed as shown in FIG. 4. The trench 44 may be formed using known photolithography techniques to create a desired trench pattern over the third dielectric 42 and chemically etching the dielectric to form the trench 44. The etchant may be selective to both the first dielectric 34 and the third dielectric 42. Accordingly, the chemical etch will form a trench 44 in the third dielectric 42, according to the pattern formed by the photoresist, and will form a contact space 46 in the third dielectric 42 formed in the through-hole 40 and in the first dielectric 34 as exposed by the through-hole 40 in the second dielectric 38. For a more detailed view of the dual-damascene structure described above, see FIG. 10, which depicts the interconnect structure described above in a three-dimensional cross-sectional view.

After etching the trench 44, a dual-damascene structure has been formed in accordance with step 16 of manufacturing process 10. In certain embodiments, the width of the trench 44 may be approximately 10 to 35 nanometers. In other embodiments, the width of the trench 44 may be less than or equal to 200 nanometers. The resulting dual-damascene structure is then cleaned to prepare it for the deposition of conductive material. It should be noted that the method of forming a dual-damascene structure described in step 16 is only one embodiment. One of ordinary skill in the art will recognize other well-known techniques for forming dual-damascene structures, therefore the present invention is not limited to the embodiment described herein.

Figure 5:
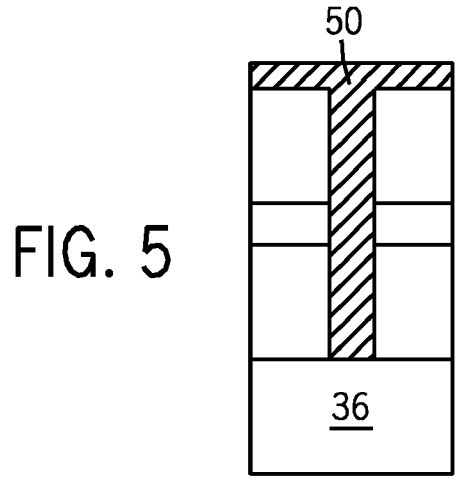

Next, the manufacturing process 10, may also include a titanium nitride (TiN) deposition 50 as indicated at step 18 and illustrated in FIG. 5. The TiN deposition 50 may be formed using a TiN deposited by CVD or low pressure CVD. In certain embodiments the TiN deposition completely fills the trench 44 and contact space 46 and blankets the surface of the third dielectric 42. While step 18 includes depositing TiN, in other embodiments, other materials may be used in place of TiN, such as Tungsten Nitride (WN), Tantalum Nitride (TaN), Tantalum Silicon Nitride (TaSiN), and Titanium Aluminum Nitride (TiAlN). The TiN deposit 50 may be amorphous rather than crystalline, in order to provide a more uniform etch-back rate.

Figure 6:
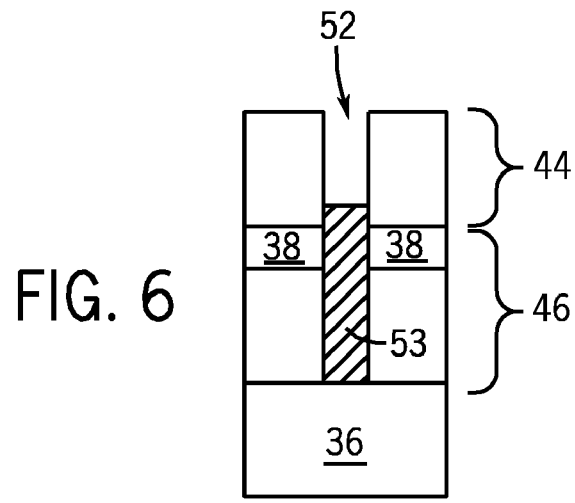

Next, the manufacturing process 10 may include etching the TiN 50 as indicated at step 20 and illustrated in FIG. 6. The TiN etch-back step 20 may optionally include a chemical-mechanical polish (CMP) process to remove excess TiN from the surface of the dual-damascene structure, thereby bringing the TiN 50 flush with the top surface of the third dielectric 42. Next, the TiN 50 may be etched by a chemical etchant that is selective to TiN. In certain embodiments, the TiN 50 is etched back to a depth that is approximately 100 to 200 angstroms above the top surface of the second dielectric 38, forming a "channel" 52 in trench 44 (in the present embodiment, the sidewalls of channel 52 are portions of the sidewalls of trench 44), as shown in FIG. 6. At the end of step 20, the TiN will completely fill the contact space 46, forming a contact 53 to the metal plug 36. Additionally, the TiN forms a thin layer over the bottom of the trench 44, thereby providing a seed on which to deposit a conductive material in the trench 44. In embodiments in which poly-silicon is deposited within the channel 52, the TiN 50 may be etched back to be flush with the top surface of the second dielectric 38 (i.e., wherein channel 52 would be the same space as trench 44).

Figure 7:
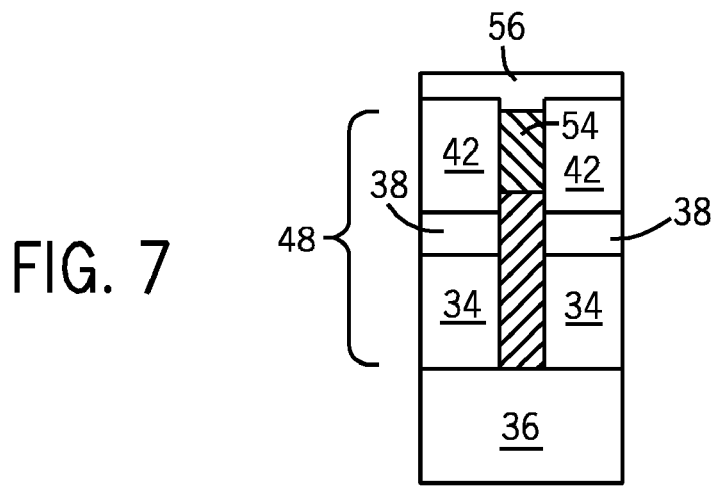
Figure 8:
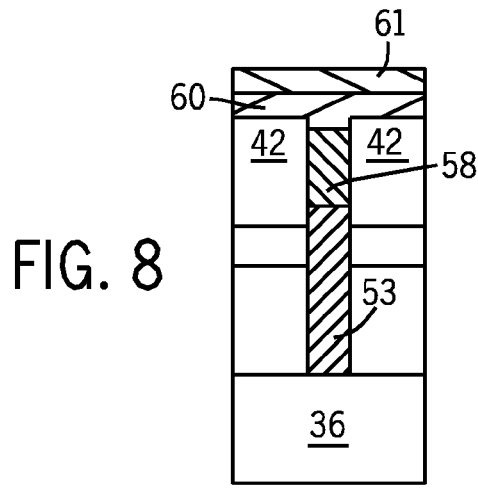
Figure 9:
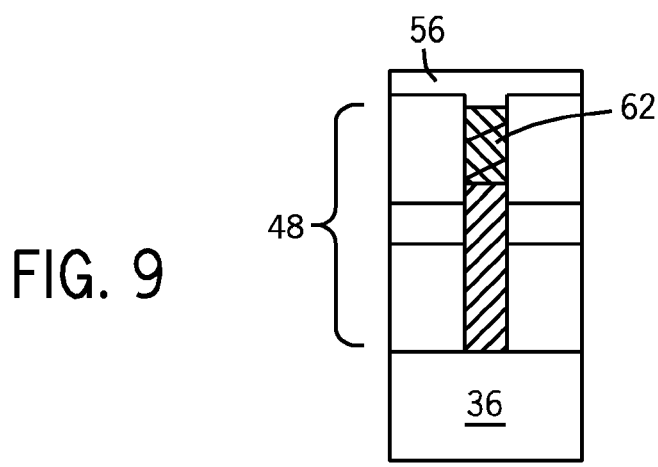

After step 20, manufacturing process 10 may proceed to either the metal subprocess 12 illustrated in FIG. 7 or the poly-silicon subprocess 14 illustrated in FIGS. 8 and 9. The metal subprocess 12 may begin with step 22 in which tungsten is deposited within the channel 52, as illustrated in FIG. 7. The tungsten 54 may be selectively deposited by a selective area CVD process to substantially fill the channel 52. Specifically, the tungsten deposit 54 may be selective to TiN. In certain embodiments, the tungsten is deposited to a thickness which brings the tungsten deposit 54 just below the surface of the third dielectric 42. Alternatively, if the tungsten goes above the top surface of the third dielectric 42, the top surface may be planarized, such as by a CMP process, to make the tungsten deposit 54 flush with the top surface of the third dielectric 42. One of ordinary skill in the art will recognize that in this embodiment the TiN contact 53 may act as a seed for the tungsten deposition 54. One of ordinary skill in the art will also recognize other low-resistance materials that may be deposited in place of tungsten. In some embodiments, the TiN contact 53 may also act as a barrier between the trench conductor and the first and second dielectrics 34 and 38.

Metal subprocess 12 may also include forming a dielectric layer 56 over the dual-damascene structure 48, which protects the surface of the semiconductor device from physical damage as well as electrical and chemical contamination. The dielectric layer 56 may be any suitable dielectric material, such as silicon nitride, silicon dioxide or a borophosphosilicate glass (BPSG), for example.

As stated above, manufacturing process 10 may also include a poly-silicon subprocess 14, in which poly-silicon is deposited within the channel 52 rather than tungsten as in the metal sub-process 12. The poly-silicon subprocess 14 may begin with step 26, in which poly-silicon is deposited within the channel 52, as shown in FIG. 8. The poly-silicon 58 may be deposited by a CVD process or a physical vapor deposition (PVD) process to substantially fill the channel 52. In certain embodiments, the poly-silicon 58 is deposited to a thickness which brings the poly-silicon 58 just below surface of the third dielectric 42. Alternatively, if the poly-silicon 58 goes above the top surface of the third dielectric 42, the top surface may be planarized, such as by a CMP process, to make the poly-silicon 58 flush with the top surface of the third dielectric 42. One of ordinary skill in the art will recognize that, in this embodiment, the TiN contact 53 acts as a barrier layer between the poly-silicon 58 and the metal plug 36.

Next, the poly-silicon subprocess 14 may include depositing a metal 60 over the poly-silicon 58 as indicated at step 28 and illustrated in FIG. 8. The metal 60 serves as a doping agent that will be diffused into the poly-silicon 58 to increase the conductivity of the poly-silicon 58. The metal 60 may be deposited over the entire semiconductor device by sputter deposition and may include any metal known for doping poly-silicon, such as nickel or cobalt, for example. Additionally, the poly-silicon subprocess 14 may also include depositing a metal cap 61 over the metal 60. The metal cap 61 may also blanket the entire semiconductor device to protect the underlying material during subsequent processing and may include titanium nitride (TiN) deposited by CVD or PVD such as sputter deposition.

After depositing the metal cap 61, rapid thermal processing (RTP) may be used to convert the poly-silicon 58 into a low-resistivity silicide 62, as indicated at step 30. In embodiments in which the metal 60 includes nickel, for example, the typical RTP process may include two RTP iterations. During the first RTP iteration the nickel in the metal 60 migrates into the poly-silicon 58 and reacts with the poly-silicon to form dinickel silicide (Ni2Si.) After the first RTP iteration, the tinanium nitride cap is removed and any unreacted nickel is cleaned from the surface. Next, during the second RTP iteration the Ni2Si is converted to nickel monosilicide (NiSi), a low-resistivity phase of nickel silicide.

Next, as shown in FIG. 9, the poly-silicon subprocess 14 may include forming a dielectric layer 56 over the dual-damascene structure 48, which protects the surface of the semiconductor device from physical damage as well as electrical and chemical contamination. The dielectric layer 56 may be any suitable dielectric material, such as silicon nitride, silicon dioxide or a borophosphosilicate glass (BPSG), for example.

Figure 10:
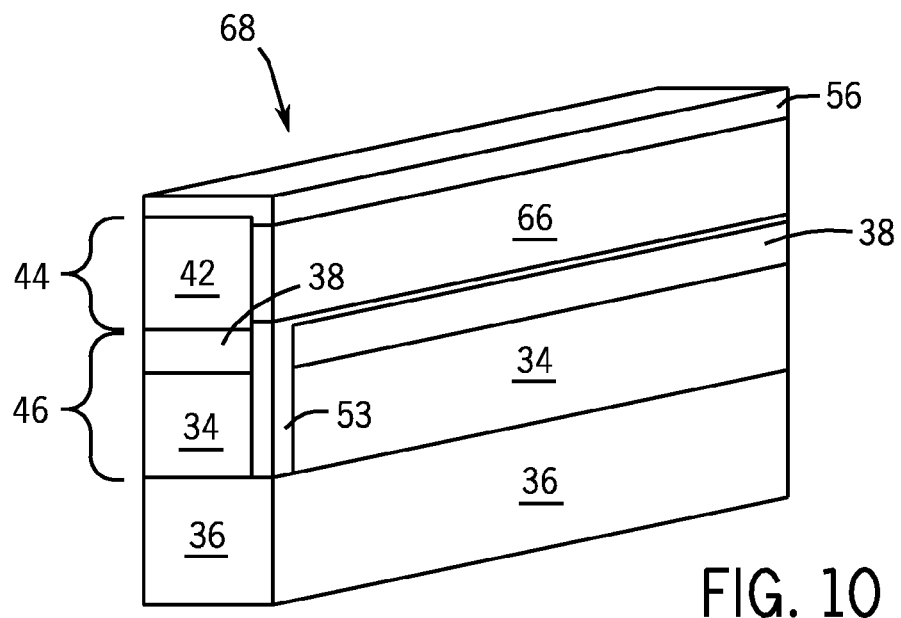

Turning to FIG. 10, a three-dimensional cross-section of a finished low-resistance interconnect fabricated in accordance with metal sub-process 12 or poly-silicon sub-process 14 is depicted. For clarity, FIG. 10 depicts a plane of the low-resistance interconnect 68 which extends lengthwise through the trench 44. In the embodiment shown, the TiN fills the contact space 46 to form contact 53. Additionally, the TiN may cover the bottom of the trench 44, forming the seed and/or barrier on which the trench conductor 66 is deposited.

Those of ordinary skill in the art will recognize the advantages of forming an interconnect in accordance with the processes describe above. For example, it will be appreciated that the trench 44 is filled almost entirely with a conductive material such as tungsten or metal silicide, with only a thin seed layer at the bottom of the trench 44. In other words, unlike prior art, the presently described embodiments do not include a resistive barrier or seed between the trench conductor 66 and the sidewalls of the trench 44. Rather, the titanium nitride formed at the bottom of or below the trench 44, in addition to forming a contact 53 between the metal plug 36 and the trench conductor 66, also acts as a barrier and a seed. This allows the conductive material inside the trench 44 to fill the entire width of the trench, resulting in reduced resistivity compared to prior art. Consequently, this may allow narrower interconnects to be fabricated compared to prior art interconnects.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of forming an interconnect in a semiconductor device, comprising:
    forming a contact comprised of a barrier material in a contact space; and
    forming conductive material in a trench over the contact, wherein the barrier material acts as a seed for the conductive material, the sidewalls of the trench comprise dielectric material and there is substantially none of the barrier material between the conductive material and the sidewalls of the trench;
    wherein substantially none of the conductive material fills the contact space.

2. The method of claim 1, wherein the barrier material provides a barrier between the conductive material and a dielectric in which the contact was formed.

3. The method of claim 1, wherein the contact is formed over a metal plug and the barrier material provides a barrier between the conductive material and the metal plug.

4. The method of claim 1, wherein the barrier material comprises titanium nitride.

5. The method of claim 1, wherein forming the conductive material comprises forming poly-silicon in the trench.

6. The method of claim 5, wherein forming the poly-silicon comprises forming a metal over the poly-silicon and heating the metal in a rapid thermal process to metallize the poly-silicon.

7. The method of claim 1, wherein forming the conductive material comprises selectively depositing tungsten in the trench.

8. The method of claim 1, wherein the width of the trench is less than approximately 35 nanometers.

9. A method of forming an interconnect in a semiconductor device, comprising:
    forming one or more metal plugs, the one or more metal plugs electrically coupled to one or more circuit components of the semiconductor device;
    forming one or more contact spaces adjacent to the one or more metal plugs and a trench adjacent to the one or more contact spaces, wherein the one or more contact spaces and the trench are formed using a single etch procedure;
    forming a barrier material in the one or more contact spaces; and
    forming a conductive material in the trench, wherein neither a barrier material nor a seed material is disposed between the sidewalls of the trench and the conductive material.

10. The method of claim 9, wherein the barrier material facilitates the formation of the conductive material in the trench.

11. The method of claim 9, wherein forming the barrier material comprises substantially filling the one or more contact spaces and the trench with the barrier material, then etching the barrier material to substantially remove the barrier material from the trench.

12. The method of claim 11, wherein forming the barrier material comprises etching the barrier material to be flush with a top surface of the one or more contact spaces.

13. The method of claim 9, wherein forming a conductive material in the trench comprises depositing the conductive material to a thickness which brings it just below a top surface of the trench.

14. The method of claim 9, comprising forming a dielectric material over the conductive material in the trench.

* * * * *